(12) United States Patent
Jung et al.

(10) Patent No.: US 9,977,292 B2
(45) Date of Patent: May 22, 2018

(54) DISPLAY DEVICE HAVING TOLERANCE TO PRESSURE OR BENDING

(71) Applicant: Samsung Display Co., LTD., Yongin-si, Gyeonggi-do (KR)

(72) Inventors: Youngmin Jung, Yongin-si (KR); Hongjoon Moon, Yongin-si (KR); Jungyul Lee, Yongin-si (KR); Jaehyoung Yoon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 14/972,611

(22) Filed: Dec. 17, 2015

(65) Prior Publication Data

US 2016/0370630 A1    Dec. 22, 2016

(30) Foreign Application Priority Data

Jun. 22, 2015    (KR) .................. 10-2015-0088714

(51) Int. Cl.
*G09G 3/36* (2006.01)
*G02F 1/1339* (2006.01)
*G06F 1/16* (2006.01)
*G02F 1/1345* (2006.01)
*G09G 3/3225* (2016.01)
(Continued)

(52) U.S. Cl.
CPC ........ *G02F 1/13394* (2013.01); *G02F 1/1345* (2013.01); *G06F 1/1652* (2013.01); *G09G 3/3648* (2013.01); *G09G 3/3677* (2013.01); *G09G 3/3225* (2013.01); *G09G 3/344* (2013.01); *G09G 2300/0408* (2013.01);
(Continued)

(58) Field of Classification Search
CPC .. G09G 3/3266; G09G 3/3674–3/3681; G09G 2310/02–2310/0216; G09G 2310/0267; G09G 2310/0278–2310/0286
See application file for complete search history.

(56) References Cited

U.S. PATENT DOCUMENTS

2010/0182226 A1*    7/2010    Umezaki ............. G02F 1/13454
345/98
2012/0032937 A1*    2/2012    Koo ...................... G09G 3/3233
345/211
(Continued)

FOREIGN PATENT DOCUMENTS

KR          101319543 B1      10/2013
KR        1020140025170 A      3/2014
(Continued)

*Primary Examiner* — Sanghyuk Park
(74) *Attorney, Agent, or Firm* — Cantor Colburn LLP (57) ABSTRACT

A display apparatus includes a first substrate including a display area and a non-display area, a gate driver positioned in the non-display area of the first substrate and including a plurality of stages cascaded, and at least one spacer disposed on the gate driver, where each of the plurality of stages includes a transistor including a first electrode connected to a clock terminal to which a clock signal is input, a second electrode connected to an output terminal which outputs a gate signal, and a gate electrode, and a capacitor including a first capacitor electrode connected to the gate electrode of the transistor and a second capacitor electrode connected to the output terminal, and the at least one spacer is disposed on the capacitor.

8 Claims, 11 Drawing Sheets

(51) Int. Cl.
  *G09G 3/34* (2006.01)
  *G11C 19/28* (2006.01)
(52) U.S. Cl.
  CPC . *G09G 2300/0426* (2013.01); *G09G 2300/08* (2013.01); *G09G 2310/0286* (2013.01); *G11C 19/28* (2013.01)

(56) References Cited

U.S. PATENT DOCUMENTS

| | | | | |
|---|---|---|---|---|
| 2012/0105339 | A1* | 5/2012 | Jung | G06F 3/044 345/173 |
| 2013/0321740 | A1 | 12/2013 | An et al. | |
| 2014/0055503 | A1 | 2/2014 | Jung et al. | |
| 2014/0055696 | A1 | 2/2014 | Lee et al. | |
| 2015/0070616 | A1* | 3/2015 | Ogasawara | G02F 1/1339 349/43 |
| 2015/0138466 | A1* | 5/2015 | Mori | G11C 19/287 349/38 |
| 2015/0261030 | A1* | 9/2015 | Chen | G02F 1/1339 349/106 |

FOREIGN PATENT DOCUMENTS

| | | |
|---|---|---|
| KR | 1020140025220 A | 3/2014 |
| KR | 1020140073271 A | 6/2014 |

\* cited by examiner

DISPLAY DEVICE HAVING TOLERANCE TO PRESSURE OR BENDING

DISPLAY APPARATUS

This application claims priority to Korean Patent Application No. 10-2015-0088714, filed on Jun. 22, 2015, and all the benefits accruing therefrom under 35 U.S.C. § 119, the content of which in its entirety is herein incorporated by reference.

BACKGROUND

1. Field

One or more exemplary embodiments relate to a display apparatus.

2. Description of the Related Art

Display apparatuses are apparatuses displaying images, and examples of the display apparatuses include a liquid crystal display apparatus, an organic light-emitting display apparatus, and an electrophoretic display apparatus, for example. In general, upper and lower substrates of a display apparatus are supported by a plurality of spacers, which are formed in a regular pattern between the upper and lower substrates, to maintain a predetermined cell gap.

SUMMARY

One or more exemplary embodiments include a display apparatus having a tolerance to pressure and/or bending.

Additional exemplary embodiments will be set forth in part in the description which follows and, in part, will be apparent from the description, or may be learned by practice of the presented embodiments.

According to one or more exemplary embodiments, a display apparatus includes a first substrate including a display area and a non-display area, a gate driver positioned in the non-display area of the first substrate and including a plurality of stages cascaded, and at least one spacer disposed on the gate driver, where each of the stages includes a transistor including a first electrode connected to a clock terminal to which a clock signal is input, a second electrode connected to an output terminal configured to output a gate signal, and a gate electrode, and a capacitor including a first capacitor electrode connected to the gate electrode of the transistor and a second capacitor electrode connected to the output terminal, and the at least one spacer is disposed on the capacitor.

In an exemplary embodiment, the gate driver may be positioned between a sealing area, which is a part of the non-display area, and the display area.

In an exemplary embodiment, the first electrode and the second electrode of the transistor may include a plurality of comb electrodes, and the plurality of comb electrodes of the first electrode and the plurality of comb electrodes of the second electrode may alternate.

In an exemplary embodiment, the capacitor may include a plurality of sub-capacitors connected in parallel, and at least one of the sub-capacitors may be disposed between the plurality of comb electrodes of the first electrode and the second electrode of the transistor.

In an exemplary embodiment, a channel width provided by the plurality of comb electrodes of the first electrode and the second electrode of the transistor may be constant regardless of the number of sub-capacitors.

In an exemplary embodiment, the at least one spacer may be disposed on the sub-capacitors.

In an exemplary embodiment, the display apparatus may further include a first capacitor disposed adjacent to the display area and including a first capacitor electrode connected to the gate electrode of the transistor and a second capacitor electrode connected to the second electrode of the transistor, and a second capacitor disposed between the plurality of comb electrodes of the first electrode and the second electrode of the transistor and including a third capacitor electrode connected to the gate electrode of the transistor and a fourth capacitor electrode connected to the plurality of comb electrodes of the second electrode of the transistor.

In an exemplary embodiment, the second capacitor may include a plurality of sub-capacitors disposed between the plurality of comb electrodes of the first electrode and the second electrode to have a predetermined distance from each other.

In an exemplary embodiment, a channel width provided by the plurality of comb electrodes of the first electrode and the second electrode of the transistor may be constant regardless of the number of sub-capacitors.

The at least one spacer may include at least one first spacer disposed on the first capacitor and at least one second spacer disposed on the second capacitor.

In an exemplary embodiment, the display apparatus may further include a third spacer disposed on a wire extending from at least one of the first electrode, the second electrode, and the gate electrode of the transistor and disposed between a sealing area, which is a part of the non-display area, and the transistor.

In an exemplary embodiment, the transistor may include a semiconductor layer in contact with the first electrode and the second electrode, and the semiconductor layer may include amorphous silicon.

In an exemplary embodiment, the at least one spacer may include the same material as a color filter in the display area.

In an exemplary embodiment, the at least one spacer may be disposed on at least one of the first substrate and a second substrate spaced apart from the first substrate.

In an exemplary embodiment, the gate electrode of the transistor and the first capacitor electrode of the capacitor may include the same material and may be on the same layer as each other.

In an exemplary embodiment, the first electrode and the second electrode of the transistor and the second capacitor electrode of the capacitor may include the same material and may be on the same layer as each other.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

As the invention allows for various changes and numerous embodiments, exemplary embodiments will be illustrated in the drawings and described in detail in the written description. Advantages and features of one or more exemplary embodiments and methods of accomplishing the same may be understood more readily by reference to the following detailed description of the one or more exemplary embodiments and the accompanying drawings. The invention may, however, be embodied in many different forms and should not be construed as being limited to the one or more exemplary embodiments set forth herein.

While such terms as "first" and "second" may be used to describe various components, such components must not be limited to the above terms. The above terms are used only to distinguish one component from another.

The singular forms "a," "an," and "the" used herein are intended to include the plural forms as well, unless the context clearly indicates otherwise.

It will be understood that the terms such as "include," "comprise," and "have" used herein specify the presence of stated features or components, but do not preclude the presence or addition of one or more other features or components.

It will be further understood that when a layer, region, or component is referred to as being "on" another layer, region, or component, it can be directly or indirectly on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, exemplary embodiments are not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Reference will now be made in detail to exemplary embodiments, examples of which are illustrated in the accompanying drawings. Like reference numerals refer to like elements throughout in the drawings, and repeated descriptions thereof will be omitted. As used herein, the term "and/or" includes any and all combinations of one or more of the associated listed items. Expressions such as "at least one of," when preceding a list of elements, modify the entire list of elements and do not modify the individual elements of the list.

Figure 1:
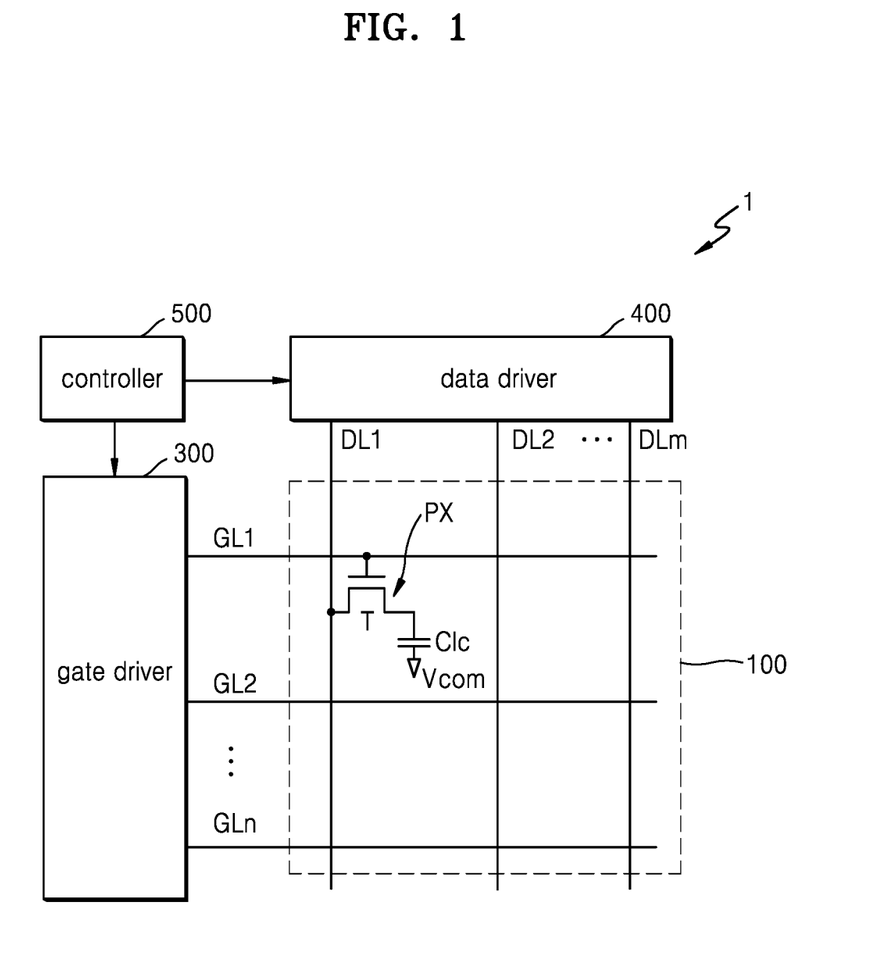
FIGS. 1 and 2 are block diagrams illustrating an exemplary embodiment of a structure of a liquid crystal display apparatus according to the invention.
Figure 2:
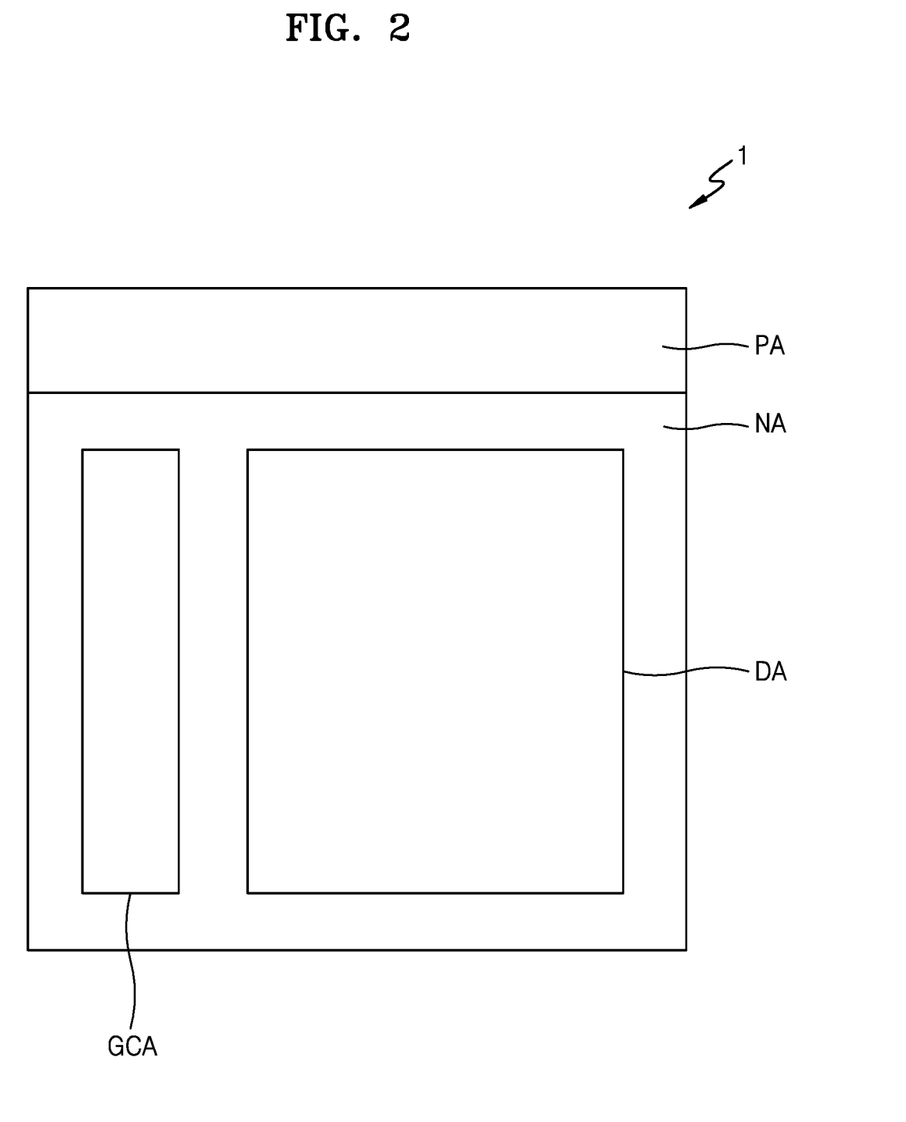

FIGS. 1 and 2 are block diagrams illustrating a structure of a liquid crystal display apparatus 1 according to an exemplary embodiment.

Referring to FIG. 1, the liquid crystal display apparatus 1 includes a display unit 100 in which a plurality of pixels PX are disposed, a gate driver 300, a data driver 400, and a controller 500.

In the display unit 100, a plurality of gate lines GL1 to GLn are regularly spaced apart from each other and arranged in rows, and a plurality of data lines DL1 to DLm are regularly spaced apart from each other and arranged in columns. The gate lines GL1 to GLn and the data lines DL1 to DLm are arranged in a matrix form, and a pixel PX is disposed over an area where the gate lines GL1 to GLn and the data lines DL1 to DLm intersect each other. The pixel PX is switched by a gate signal from a gate line, and the transmittance of the pixel PX is determined by a data signal from a data line. The pixel PX includes a thin film transistor ("TFT") T, a pixel electrode connected to the TFT T, and a liquid crystal capacitor Clc.

The gate driver 300 may generate a gate signal having a combination of a gate on voltage at an active level and a gate off voltage at an inactive level and sequentially supply the gate signal to the display unit 100 through the gate lines GL1 to GLn. The TFT T is turned on or off by the gate on/off voltage. Although, in FIG. 1, one gate driver 300 is provided, the invention is not limited thereto, and two gate drivers may be provided on left and right sides of the display unit 100.

The data driver 400 may sequentially supply a data signal to the display unit 100 through the data lines DL1 to DLm. The data driver 400 converts image data that is input from the controller 500 into a data signal in the form of a voltage or current.

The controller 500 receives an input control signal for controlling input image data and display thereof from an external graphic controller (not shown). Examples of the input control signal include a horizontal synchronization signal, a vertical synchronization signal, and a main clock. The controller 500 provides image input data to the data driver 400, generates a gate control signal and a data control signal, and respectively provides the gate control signal and the data control signal to the gate driver 300 and the data driver 400.

The liquid crystal display apparatus 1 according to an exemplary embodiment has a part of the gate driver 300 or the entire gate driver 300 directly disposed on a substrate during a process of forming the pixel PX. Thus, a part of the gate driver 300 or the entire gate driver 300 may be completed during a process of manufacturing the pixel PX on a substrate, thereby reducing cost and processes.

Referring to FIG. 2, the liquid crystal display apparatus 1 includes a display area DA for transmitting light and displaying an image, and a non-display area NA around the display area DA. The display unit 100 is provided in the display area DA. The non-display area NA includes a gate circuit area GCA in which the gate driver 300 is provided, a pad area PA in which a plurality of pads are provided, and a sealing area SA (refer to FIG. 3) in which a sealing member (e.g. sealing material) 50 (refer to FIG. 3) is positioned. The data driver 400 may be electrically connected to the pads and mounted in the pad area PA.

Figure 3:
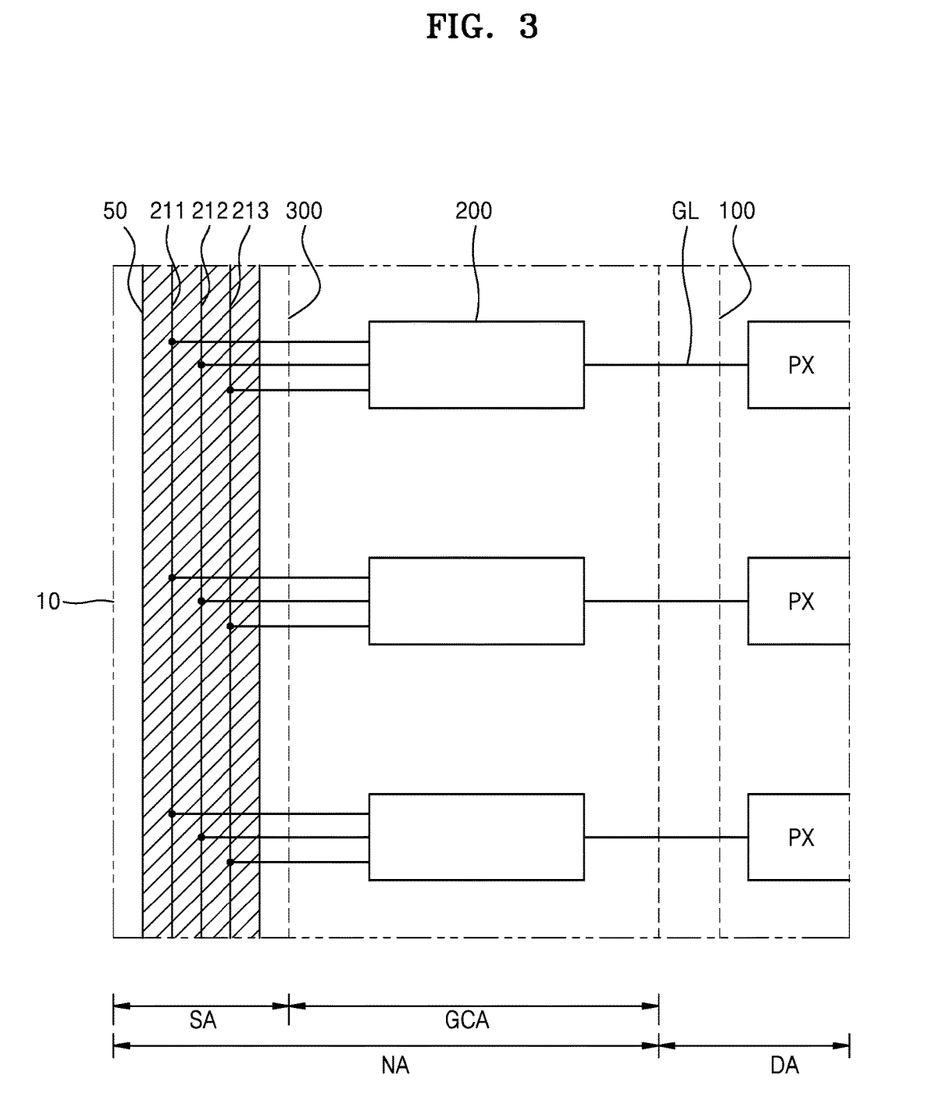
FIG. 3 is a plan view illustrating a part of the liquid crystal display apparatus of FIG. 1.
Figure 4:
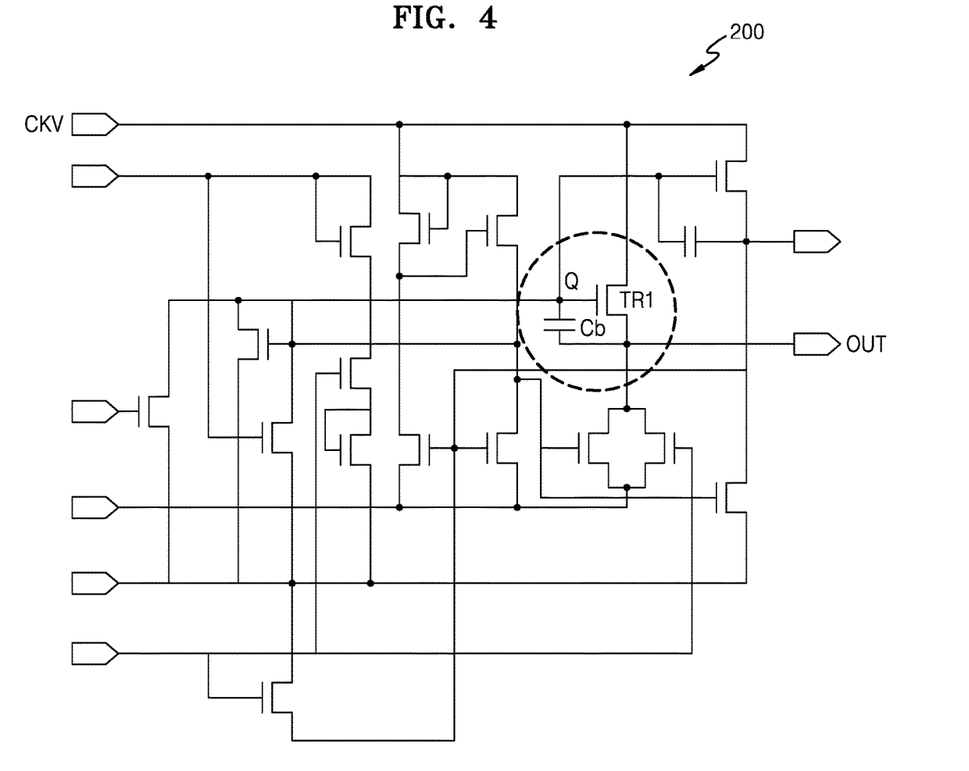
FIG. 4 is a diagram of a circuit included in a stage of FIG. 3.

FIG. 3 is a plan view illustrating a part of the liquid crystal display apparatus 1 of FIG. 1. FIG. 4 is an equivalent circuit diagram of a circuit portion of FIG. 3.

Referring to FIG. 3, the liquid crystal display apparatus 1 includes the display unit 100 in the display area DA of a first substrate 10, and the gate driver 300 in the gate circuit area GCA of the non-display area NA.

The gate driver 300 is positioned between the display unit 100 in the display area DA and the sealing member 50 in the sealing area SA. Under the sealing member 50, input signal lines 211, 212, and 213 for applying signals, such as a clock signal, a reverse clock signal, and an input signal from a previous stage or a next stage, to the gate driver 300 may be disposed.

The gate driver 300 may include a plurality of stages 200 cascaded. Each of the plurality of stages 200 is connected to a gate line GL while being matched to the gate line GL in a one-to-one relationship, and the stage 200 outputs a gate signal to its corresponding gate line GL.

As illustrated in FIG. 4, each of the stages 200 may include a plurality of circuit devices such as a plurality of TFTs and a plurality of capacitors. Each of the stages 200 includes a transmission transistor TR1 for outputting a gate signal to a corresponding gate line GL and a boost capacitor Cb.

The transmission transistor TR1 includes a first electrode connected to a clock terminal CKV, a second electrode connected to an output terminal OUT, and a gate electrode. The transmission transistor TR1 is provided between the clock terminal CKV and the output terminal OUT, and provides or does not provide a clock signal to the output terminal OUT depending on an electric potential of the gate electrode. When the transmission transistor TR1 is turned on and a clock signal from the clock terminal CKV has a high level, an electric potential of a node Q becomes higher than the high level of the clock signal due to the boost capacitor Cb. Thus, an output of the transmission transistor TR1 is improved. The output terminal OUT is electrically connected to the gate line GL.

The boost capacitor Cb includes a first capacitor electrode connected to the gate electrode of the transmission transistor TR1 and a second capacitor electrode connected to the second electrode of the transmission transistor TR1 and the output terminal OUT.

One spacer or a plurality of spacers may be spaced apart from each other with a predetermined distance on the gate driver 300, that is, on the stage 200. A spacer may be disposed on some of the circuit devices included in the stage 200. The spacer maintains a cell gap between two substrates, alleviates external pressure, and prevents the occurrence of a short-circuit between the two substrates due to external pressure.

Figure 5:
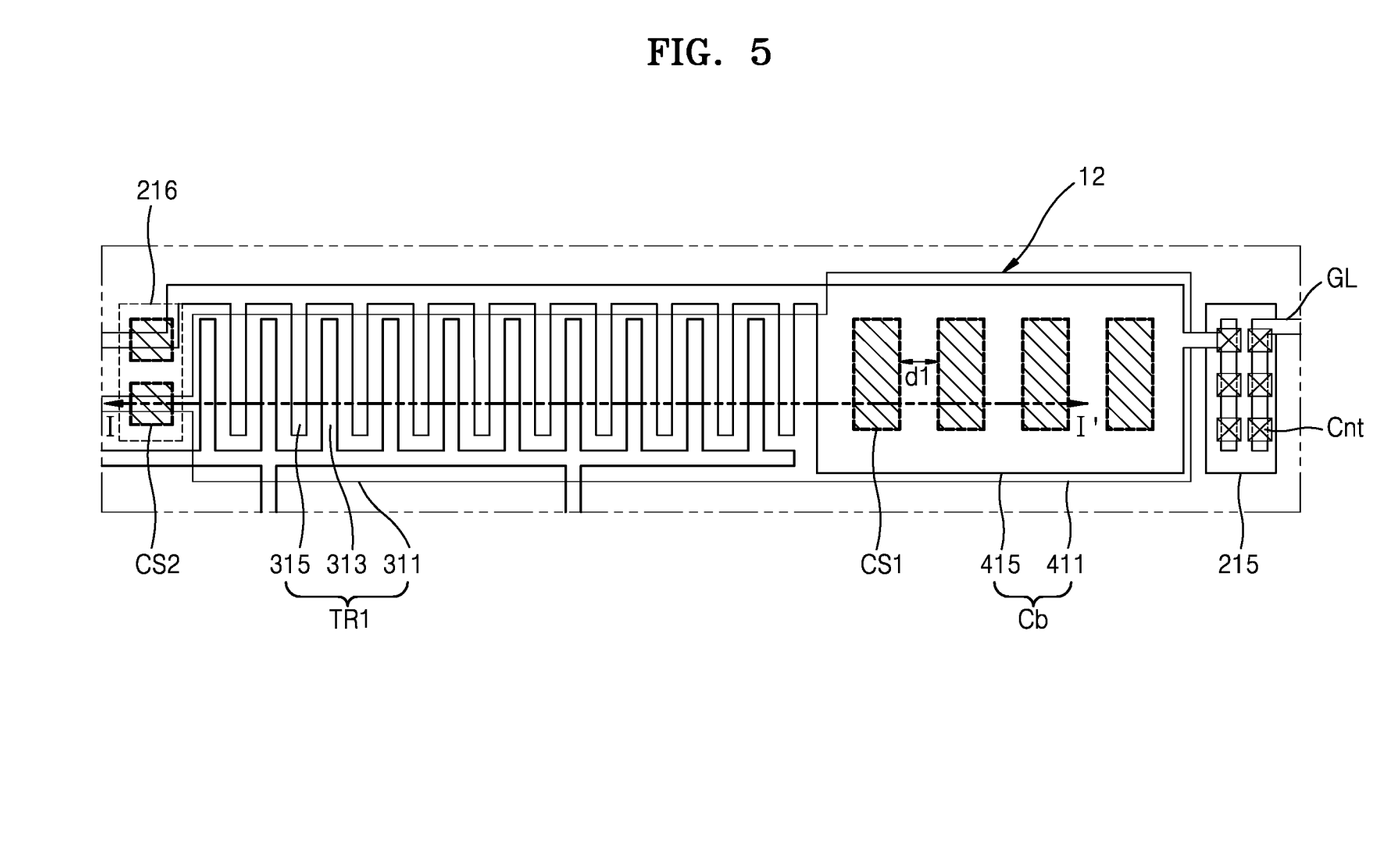
FIG. 5 is a plan view illustrating a part of an exemplary embodiment of a stage according to the invention.
Figure 6:
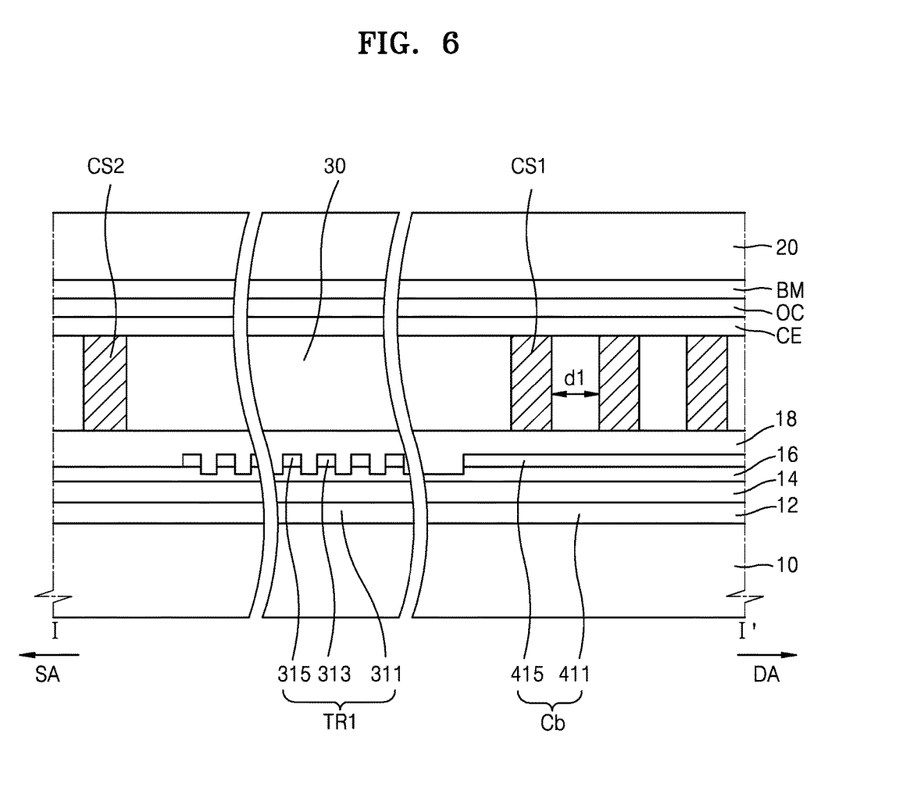
FIG. 6 is a cross-sectional view taken along line I-I' of FIG. 5.

FIG. 5 is a plan view illustrating a part of the stage 200 according to an exemplary embodiment. FIG. 6 is a cross-sectional view taken along line I-I' of FIG. 5.

In FIGS. 5 and 6, only the transmission transistor TR1 and the boost capacitor Cb having large sizes from among the circuit devices included in the stage 200 are illustrated as a part of the non-display area NA. The other transistors and capacitor respectively have different plane structures from the transmission transistor TR1 and the boost capacitor Cb but the same cross-section structures as those of the transmission transistor TR1 and the boost capacitor Cb.

Referring to FIG. 5, the transmission transistor TR1 includes a gate electrode 311, a first electrode 313, and a second electrode 315.

Each of the first electrode 313 and the second electrode 315 of the transmission transistor TR1 includes a plurality of comb electrodes, and the comb electrodes of the first electrode 313 and the second electrode 315 alternate. As the first electrode 313 and the second electrode 315 of the transmission transistor TR1 are provided in comb shapes, a wide channel width may be obtained. The first electrode 313 and the second electrode 315 may be in direct contact with a semiconductor layer under the first electrode 313 and the second electrode 315.

The boost capacitor Cb includes a first capacitor electrode 411 including the same material and on the same layer as the gate electrode 311 of the transmission transistor TR1, and a second capacitor electrode 415 including the same material and on the same layer as the first electrode 313 and the second electrode 315 of the transmission transistor TR1.

The gate electrode 311 of the transmission transistor TR1 and the first capacitor electrode 411 of the boost capacitor Cb may be provided using first conductive films. The first electrode 313 and the second electrode 315 of the transmission transistor TR1 and the second capacitor electrode 415 of the boost capacitor Cb may be provided using second conductive films.

The first capacitor electrode 411 of the boost capacitor Cb is connected to the gate electrode 311 of the transmission transistor TR1. The second capacitor electrode 415 of the boost capacitor Cb is connected to the second electrode 315 of the transmission transistor TR1, and may be electrically connected to a connection pattern 215 via contact holes Cnt, thereby being electrically connected to the gate line GL of the display unit 100.

A first spacer CS1 is disposed on the boost capacitor Cb. A plurality of first spacers CS1 may be spaced apart from each other with a predetermined distance d1 according to a size of the boost capacitor Cb.

A second spacer CS2 is disposed on a connection portion for connecting the transmission transistor TR1 to the other TFT and/or capacitor, that is, on a wire portion 216 extending from the first electrode 313, the second electrode 315, or the gate electrode 311 of the transmission transistor TR1. A plurality of second spacers CS2 may be spaced apart from each other with a proper distance according to an area in which the wire portion 216 is positioned.

Referring to FIG. 6, the liquid crystal display apparatus 1 according to an exemplary embodiment includes the first substrate 10, a second substrate 20, a liquid crystal layer 30 between the first substrate 10 and the second substrate 20.

The stage 200 (refer to FIG. 3) of the gate driver 300 (refer to FIG. 3) is disposed in the non-display area NA (refer to FIG. 3) of the first substrate 10. A buffer layer may be further disposed on the first substrate 10, and the stage 200 may be disposed on the buffer layer. As illustrated in FIG. 4, the stage 200 may include a plurality of TFTs and capacitors.

The transmission transistor TR1 and the boost capacitor Cb are disposed adjacent to each other. The transmission transistor TR1 and the boost capacitor Cb may be disposed adjacent to the display area DA, and the boost capacitor Cb may be disposed closer to the display area DA than the transmission transistor TR1. The other circuit devices of the stage 200 are disposed between an inner edge of the sealing member 50 (refer to FIG. 3) in the sealing area SA and the transmission transistor TR1.

A first conductive layer 12 is provided in the non-display area NA of the first substrate 10. A part of the first conductive layer 12 serves as the gate electrode 311 of the transmission transistor TR1 and the first capacitor electrode 411 of the boost capacitor Cb. In an exemplary embodiment, the first conductive layer 12 may include a single or multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example.

A first insulation layer 14 is disposed on the first conductive layer 12. The first insulation layer 14 serves as a gate insulation layer of the transmission transistor TR1 and a dielectric layer of the boost capacitor Cb. In an exemplary embodiment, the first insulation layer 14 may include a single layer or layers including an inorganic insulation film such as silicon nitride ($SiN_x$) and/or silicon oxide ($SiO_x$), for example.

A semiconductor layer 16 is disposed on the first insulation layer 14. In an exemplary embodiment, the semiconductor layer 16 may include amorphous silicon. However, exemplary embodiments are not limited thereto, and the semiconductor layer 16 may include various materials. In an exemplary embodiment, the semiconductor layer 16 may include an inorganic semiconductor material such as crystalline silicon, for example. In another exemplary embodiment, the semiconductor layer 16 may include an oxide semiconductor or an organic semiconductor material, for example.

A second conductive layer is disposed on the semiconductor layer 16, and the second conductive layer is patterned to form the first electrode 313 and the second electrode 315 of the transmission transistor TR1 and the second capacitor electrode 415 of the boost capacitor Cb. In an exemplary embodiment, the second conductive layer may include a single or multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), for example.

A second insulation layer 18 may be provided as a protective layer on the transmission transistor TR1 and the boost capacitor Cb. The second insulation layer 18 may include a single layer or layers including an inorganic insulation film such as the first insulation layer 14 and/or an organic insulation film. In an exemplary embodiment, the organic insulation film may include polyimide, polyamide, acrylic resin, etc., for example.

In the non-display area NA of the second substrate 20, a black matrix BM, an overcoat film OC, and a common electrode CE to which a common voltage Vcom is applied may be sequentially disposed.

Although not illustrated, a plurality of color filters may be provided in the display area DA, and the color filters may be provided in the first substrate 10 or the second substrate 20.

The first spacer CS1 and the second spacer CS2 are disposed between the first substrate 10 and the second substrate 20. Along with a spacer provided in the display area DA to maintain a cell gap, the first spacer CS1 and the second spacer CS2 maintain a cell gap between the first substrate 10 and the second substrate 20, alleviate external pressure, and prevent the occurrence of a short-circuit between the first substrate 10 and the second substrate 20 due to external pressure.

The first spacer CS1 and the second spacer CS2 may include the same material and in the same process as those of the spacer provided in the display area DA to maintain a cell gap. In an exemplary embodiment, the first spacer CS1 and the second spacer CS2 may be provided by using various known materials, such as resin, for example, polyacrylate resin and polyimide resin, or a silica-based inorganic material, but are not limited thereto.

The first spacer CS1 and the second spacer CS2 may be provided in the non-display area NA of the first substrate 10, the second substrate 20, or both of the first substrate 10 and the second substrate 20 to have width and thickness that maintains a cell gap.

The first spacer CS1 and the second spacer CS2 may include the same materials as the color filters in the display area DA. That is, the first spacer CS1 and the second spacer CS2 may include one or more materials used to form a red color filter, a blue color filter, and a green color filter, for example. In this case, in a process of forming the color filters in the display area DA of the first substrate 10 or the second substrate 20, the first spacer CS1 and the second CS2 may be provided in the non-display area NA of the same layer as a substrate on which the color filters are provided. In an alternative exemplary embodiment, the first spacer CS1 and the second CS2 may be provided in the non-display area NA of a substrate and/or a layer different from the substrate and the layer on which the color filters are provided to have thickness for maintaining a cell gap.

In another exemplary embodiment, the first spacer CS1 and the second spacer CS2 may include a color filter pattern including the same material as the color filters in the display area DA and a supporting pattern on the color filter pattern. The color filter pattern and the supporting pattern may directly contact each other, or at least one layer including another material may be provided between the color filter pattern and the supporting pattern.

In an exemplary embodiment, the first spacer CS1 and the second spacer CS2 may have circular, square, or rectangular shapes, or may have other modified shapes. The number of first spacers CS1 and second spacers CS2 may be determined based on the minimum density or number needed to compensate for a cell gap of the non-display area NA.

The first spacer CS1 and the second spacer CS2 may be disposed on a capacitor included in the stage 200 or on a single or dual metal layer.

The first spacer CS1 may be disposed on the boost capacitor Cb to overlap the boost capacitor Cb. The first spacers CS1 may be spaced apart from each other with the predetermined distance d1 according to a size of the boost capacitor Cb.

The second spacer CS2 may be disposed on a connection portion for connecting the transmission transistor TR1 to the other TFT, that is, on the wire portion 216 extending from the first electrode 313, the second electrode 315, or the gate electrode 311 of the transmission transistor TR1, to partially overlap a wire. The second spacers CS2 may be spaced apart from each other with a proper distance according to an area in which the wire portion 216 is positioned.

Sizes of the first spacer CS1 and the second spacer CS2 may be identical to or different from each other. Also, sizes of the first spacers CS1 may be identical to or different from each other, and sizes of the second spacers CS2 may be identical to or different from each other. In an exemplary embodiment, the first spacer CS1 and the second spacer CS2 may have a width of 20 micrometers (μm) or greater.

A parasitic capacitor due to the transmission transistor TR1 of the first substrate 10 and the common electrode CE of the second substrate 20 uses the liquid crystal layer 30 and the second insulation layer 18 as a dielectric layer. When a spacer is disposed on the transmission transistor TR1 to overlap the transmission transistor TR1, a dielectric constant of the parasitic capacitor and/or a thickness of the dielectric layer may change, thereby causing poor driving due to a change in capacitance of the parasitic capacitor.

In exemplary embodiments, a spacer is not disposed on the transmission transistor TR1 so as to deter a change in parasitic capacitor capacitance between the transmission transistor TR1 of the first substrate 10 and the common electrode CE of the second electrode 20.

The first spacer CS1 and the second spacer CS2 may be disposed on the first substrate 10 or the second substrate 20, or may be respectively disposed on the first substrate 10 and the second substrate 20 to face each other. In the exemplary embodiment of FIG. 6, the first spacer CS1 and the second spacer CS2 are in contact with the first substrate 10 and the second substrate 20, but exemplary embodiments are not limited thereto. In another exemplary embodiment, the first spacer CS1 and the second spacer CS2 may have predetermined distances from the first substrate 10 or the second substrate 20, for example.

Although not illustrated, an alignment film giving directional nature to molecule arrangement of a liquid crystal may be disposed on each of the facing inner surfaces of the first substrate 10 and the second substrate 20. In addition, a polarizer may be further provided on an outer surface of at least one of the first substrate 10 and the second substrate 20.

Figure 7:
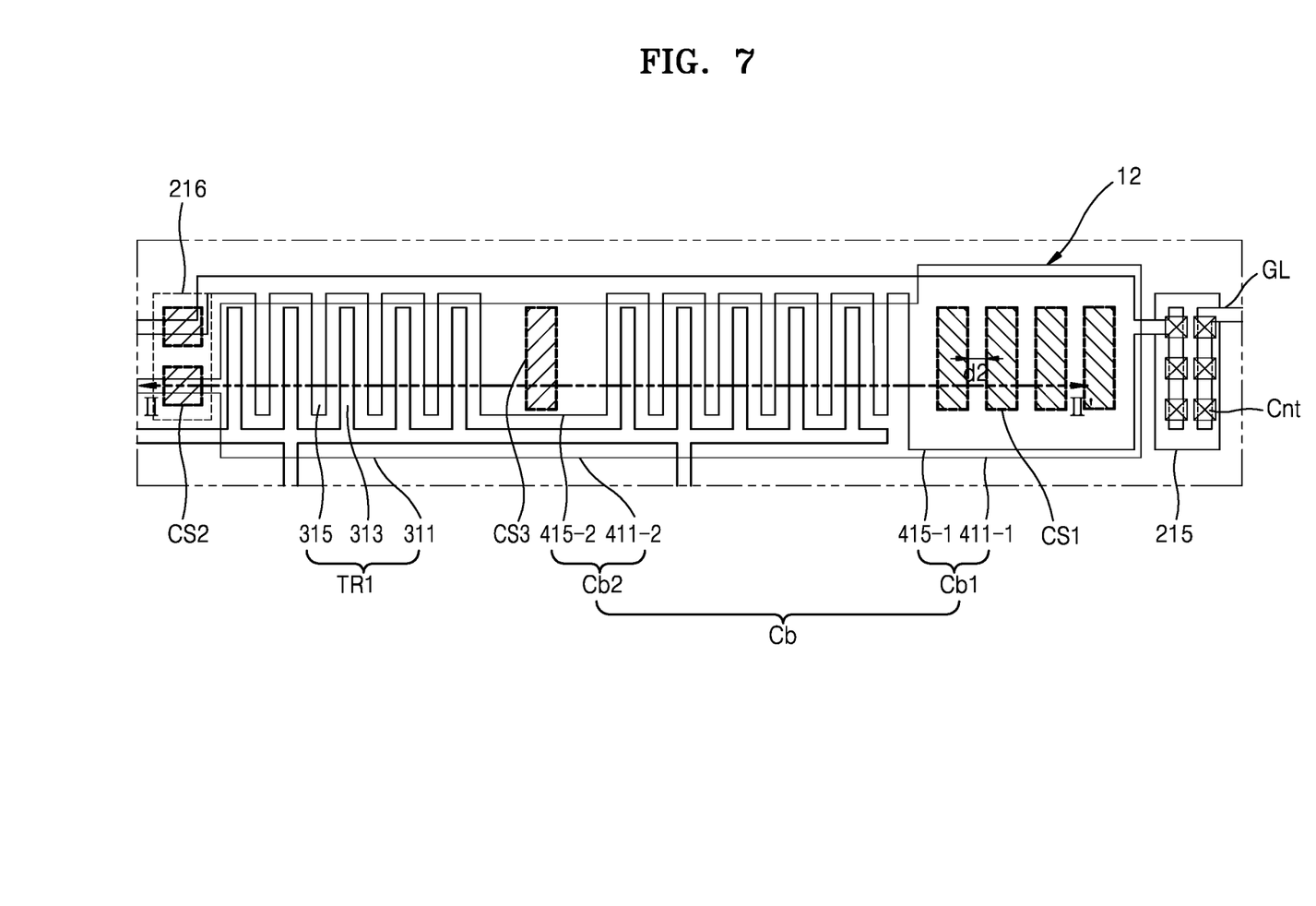
FIGS. 7 and 9 are plan views illustrating a part of other exemplary embodiments of a circuit portion according to the invention.
Figure 8:
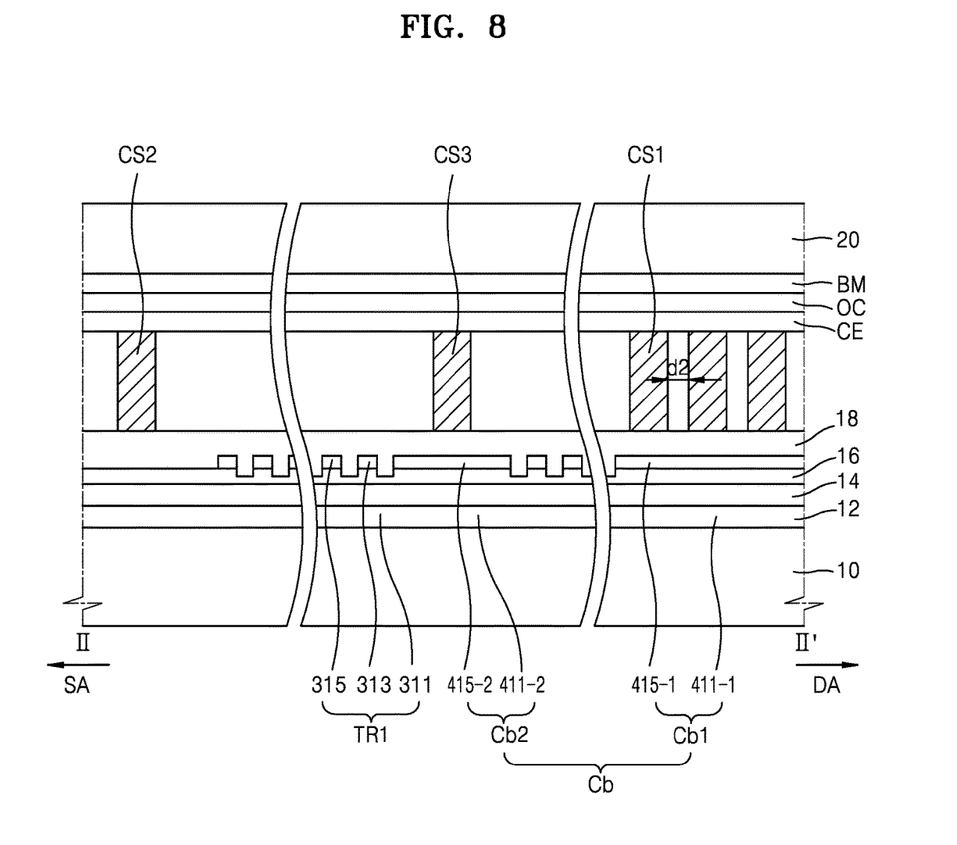
FIG. 8 is a cross-sectional view taken along line II-II' of FIG. 7.
Figure 9:
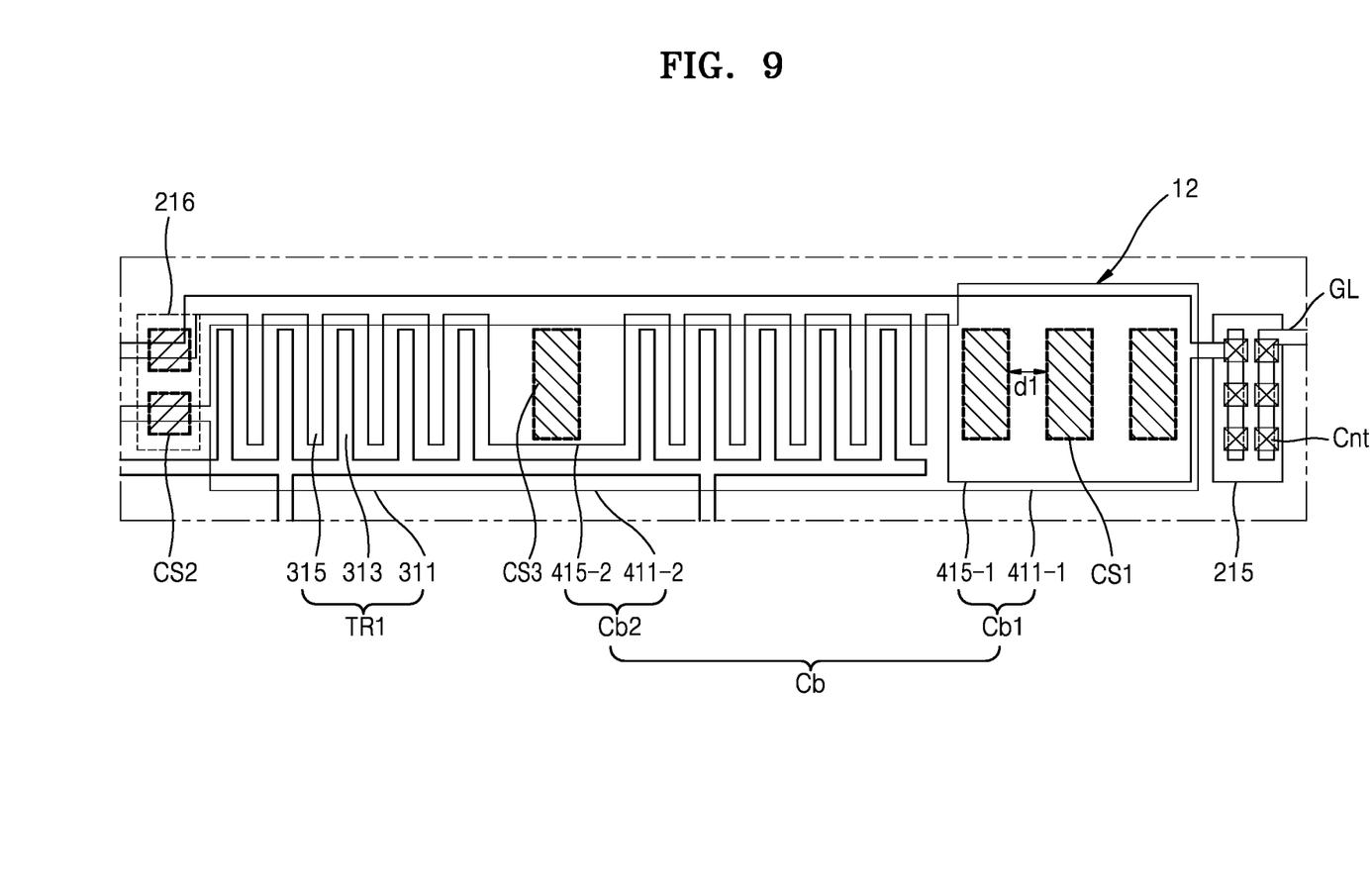

FIGS. 7 and 9 are plan views illustrating a part of a circuit portion according to other exemplary embodiments. FIG. 8 is a cross-sectional view taken along line II-II' of FIG. 7.

Referring to FIGS. 7 and 8, the boost capacitor Cb is divided into a first boost capacitor Cb1 and a second boost capacitor Cb2, and the second boost capacitor Cb2 is provided within the transmission transistor TR1. Description of the same configuration as the exemplary embodiment of FIGS. 5 and 6 will be omitted and different configurations will be mainly described below.

The boost capacitor Cb may be divided into a plurality of sub-capacitors connected in parallel. In an exemplary embodiment, the boost capacitor Cb may include the first boost capacitor Cb1 and the second boost capacitor Cb2, for example.

The first boost capacitor Cb1 includes a first capacitor electrode 411-1 and a second capacitor electrode 415-1.

The second boost capacitor Cb2 is disposed between the comb electrodes of the first electrode 313 and the second electrode 315 of the transmission transistor TR1. The second boost capacitor Cb2 includes a first capacitor electrode 411-2 and a second capacitor electrode 415-2. The second capacitor electrode 415-2 of the second boost capacitor Cb2 is connected to the second electrode 315 of the transmission transistor TR1.

The first spacers CS1 are spaced apart from each other with a predetermined distance d2 on the first boost capacitor Cb1. The first spacers CS1 may be spaced apart from each other with the predetermined distance d2 according to a size of the boost capacitor Cb.

The second spacer CS2 may be disposed on the wire portion 216 to overlap a wire. The second spacers CS2 may be spaced apart from each other with a proper distance according to an area in which the wire portion 216 is positioned.

A third spacer CS3 may be disposed on the second boost capacitor Cb2. The number of third spacers CS3 may be determined based on the number of second boost capacitors Cb2 disposed (e.g., inserted) in the transmission transistors TR1.

A size of the first boost capacitor Cb1 is less than that of the boost capacitor Cb of FIG. 5 at a corresponding position. Accordingly, the distance d2 between the first spacers CS1 on the first boost capacitor Cb1 decreases. In another exemplary embodiment, as illustrated in FIG. 9, the number of first spacers CS1 on the first boost capacitor Cb1 may be decreased so that the distance between the first spacers CS1 on the boost capacitor Cb is equal to the distance d1 between the first spacers CS1 of FIG. 5.

Due to pressure applied to a display apparatus or bending of a display apparatus, a possibility that short-circuit of the first substrate 10 and the second substrate 20 may occur may increase in an area in which no spacer is present. Also, due to bending of a substrate in a high-temperature state (e.g. in a driving state), a possibility that a cell gap may change increases. As the transmission transistor TR1 in particular is provided in a large size, an area in which the transmission transistor TR1 is disposed is vulnerable to pressure or bending.

In the exemplary embodiments of FIGS. 7 and 9, the boost capacitor Cb is divided into a plurality of numbers, and at least one of the plurality of boost capacitors Cb obtained by dividing the boost capacitor Cb is separated therefrom and disposed within the transmission transistor TR1, thereby having a parallel connection structure. The sum of capacitances of the sub boost capacitors Cb obtained by dividing the boost capacitor Cb is identical to the capacitance of the single boost capacitor Cb before dividing the boost capacitor Cb.

Even when the boost capacitor Cb is disposed (e.g., inserted) in the transmission transistor TR1, the transmission transistor TR1 is provided so as not to change the entire size of the transmission transistor TR1, thereby maintaining a constant channel width. That is, the entire channel width of the transmission transistor TR1 may be constant regardless of the number of sub-capacitors inserted in the transmission transistor TR1. According to exemplary embodiments, a cell gap of the non-display area NA may be maintained while the entire channel width of the transmission transistor TR1 and the entire capacitance of the boost capacitor Cb are maintained constantly.

In the exemplary embodiments of FIGS. 7 and 9, an example in which the boost capacitor Cb is divided into the two boost capacitors, the first boost capacitor Cb1 and the second boost capacitor Cb2, is illustrated. However, exemplary embodiments are not limited thereto. In an exemplary embodiment, the boost capacitor Cb may be divided into two or more sub-capacitors, and the two or more sub-capacitors may be spaced apart from each other with a predetermined distance in the transmission transistor TR1, for example. At least one of the two or more sub-capacitors obtained by dividing the boost capacitor Cb may be separated therefrom and disposed in at least one vulnerable area in the transmission transistor TR1 to stably maintain a cell gap of the non-display area NA.

Figure 10:
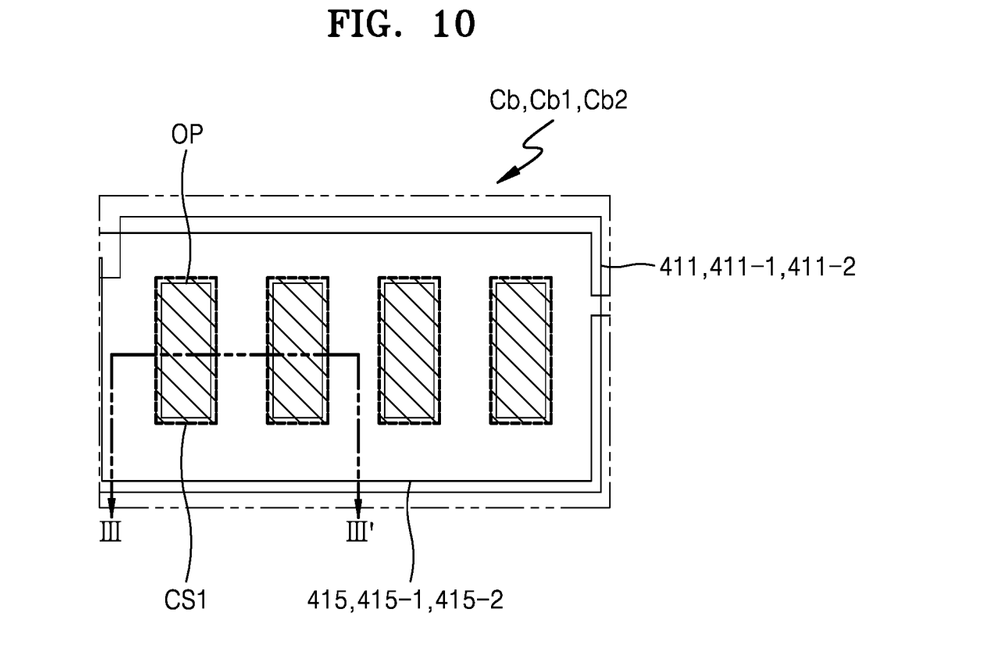
FIG. 10 is a plan view illustrating another exemplary embodiment of a structure of a boost capacitor according to the invention.
Figure 11:
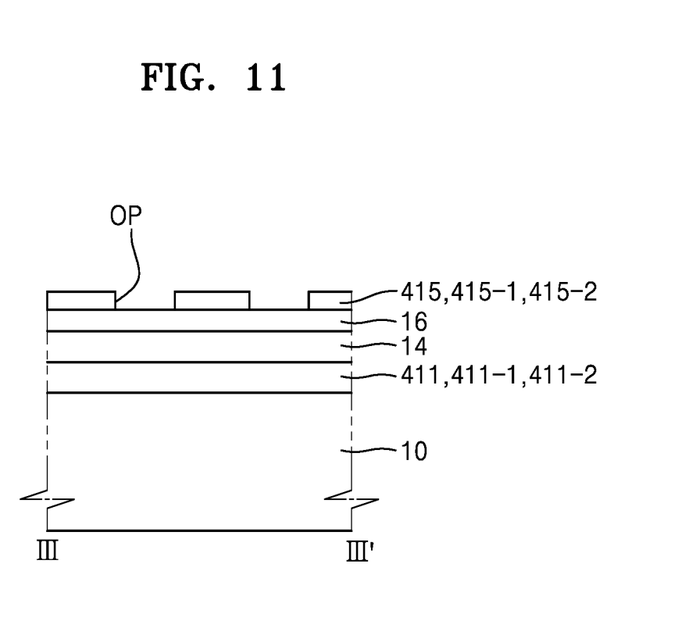
FIG. 11 is a cross-sectional view taken along line III-III' of FIG. 10.

FIG. 10 is a plan view illustrating a structure of the boost capacitor Cb according to another exemplary embodiment. FIG. 11 is a cross-sectional view taken along line III-III' of FIG. 10.

Referring to FIGS. 10 and 11, at least one opening OP may be defined in the second capacitor electrodes 415, 415-1, and 415-2 of the boost capacitor Cb illustrated in FIG. 5 and the first boost capacitor Cb1 and the second boost capacitor Cb2 illustrated in FIGS. 7 and 9.

The first spacer CS1 and/or the third spacer CS3 may be disposed on the opening OP to overlap the opening OP. When the first spacer CS1 and the third spacer CS3 have a dual structure such as the color filter pattern and the supporting pattern on the color filter pattern, the opening OP may be defined in the second capacitor electrodes 415, 415-1, and 415-2 to prevent the occurrence of a step from a nearby spacer having a single structure.

According to exemplary embodiments, a circuit portion disposed in a non-display portion may be provided, and a spacer maintaining a cell gap without a change in characteristics of a transistor disposed at a position vulnerable to pressure and/or bending and a change in parasitic capacitance may be disposed on the circuit portion.

In the exemplary embodiments, the transmission transistor TR1 is a bottom gate-type TFT, but exemplary embodiments are not limited thereto. That is, the transmission transistor TR1 may be a top gate-type TFT.

In the exemplary embodiments, a spacer disposed in a non-display portion of a liquid crystal display apparatus has been described as an example. However, exemplary embodiments may be applied to various display apparatuses such as an organic light-emitting display apparatus besides the liquid crystal display apparatus.

According to one or more exemplary embodiments, a display apparatus may have improved reliability of cell gap maintenance and may have a tolerance to pressure and/or bending. However, the scope of the invention is not limited by such an effect.

It should be understood that exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a first substrate comprising a display area and a non-display area;
a gate driver positioned in the non-display area of the first substrate and comprising a plurality of stages cascaded; and
at least one spacer disposed on the gate driver,
wherein each of the plurality of stages comprises:
a transistor comprising a first electrode connected to a clock terminal to which a clock signal is input, a second electrode connected to an output terminal which outputs a gate signal, and a gate electrode; and
a capacitor comprising a first capacitor electrode connected to the gate electrode of the transistor and a second capacitor electrode connected to the output terminal, and
the at least one spacer is disposed on the capacitor,
wherein the first electrode and the second electrode of the transistor comprise a plurality of comb electrodes, and the plurality of comb electrodes of the first electrode and the plurality of comb electrodes of the second electrode alternate, and
wherein the capacitor further comprises a plurality of sub-capacitors connected in parallel, and at least one of the plurality of sub-capacitors is disposed between the plurality of comb electrodes of the first electrode and the second electrode of the transistor.

2. The display apparatus of claim 1, wherein a channel width provided by the plurality of comb electrodes of the first electrode and the second electrode of the transistor is constant regardless of a number of the plurality of sub-capacitors.

3. The display apparatus of claim 1, wherein the at least one spacer is disposed on the plurality of sub-capacitors.

4. A display apparatus comprising:
a first substrate comprising a display area and a non-display area;
a gate driver positioned in the non-display area of the first substrate and comprising a plurality of stages cascaded; and
at least one spacer disposed on the gate driver,
wherein each of the plurality of stages comprises:
a transistor comprising a first electrode connected to a clock terminal to which a clock signal is input, a second electrode connected to an output terminal which outputs a gate signal, and a gate electrode; and
a capacitor comprising a first capacitor electrode connected to the gate electrode of the transistor and a second capacitor electrode connected to the output terminal,
the at least one spacer is disposed on the capacitor
wherein the first electrode and the second electrode of the transistor comprise a plurality of comb electrodes, and the plurality of comb electrodes of the first electrode and the plurality of comb electrodes of the second electrode alternate, and
the capacitor further comprises a first capacitor and a second capacitor,
the first capacitor is disposed adjacent to the display area and comprising a first capacitor electrode connected to the gate electrode of the transistor and a second capacitor electrode connected to the second electrode of the transistor; and
the second capacitor is disposed between the plurality of comb electrodes of the first electrode and the second electrode of the transistor and comprising a third capacitor electrode connected to the gate electrode of the transistor and a fourth capacitor electrode connected to the plurality of comb electrodes of the second electrode of the transistor.

5. The display apparatus of claim 4, wherein the second capacitor further comprises a plurality of sub-capacitors disposed between the plurality of comb electrodes of the first electrode and the second electrode to have a predetermined distance from each other.

6. The display apparatus of claim 5, wherein a channel width provided by the plurality of comb electrodes of the first electrode and the second electrode of the transistor is constant regardless of a number of the plurality of sub-capacitors.

7. The display apparatus of claim 4, wherein the at least one spacer comprises:
   at least one first spacer disposed on the first capacitor; and
   at least one second spacer disposed on the second capacitor.

8. The display apparatus of claim 7, further comprising
   a third spacer disposed on a wire extending from at least one of the first electrode, the second electrode, and the gate electrode of the transistor and disposed between a sealing area, which is a part of the non-display area, and the transistor.

* * * * *